United States Patent
Watkins et al.

(10) Patent No.: US 6,359,483 B1
(45) Date of Patent: Mar. 19, 2002

(54) INTEGRATED CIRCUIT CLOCK DISTRIBUTION SYSTEM

(75) Inventors: Daniel Watkins, Los Altos; Jen-Hsun Huang, San Jose; Ronald Yu, Sunnyvale, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/521,811

(22) Filed: Mar. 9, 2000

Related U.S. Application Data

(63) Continuation of application No. 08/605,451, filed on Feb. 26, 1996, now abandoned.
(51) Int. Cl.[7] .................................................. H03L 7/06
(52) U.S. Cl. ........................................ 327/158; 327/159
(58) Field of Search ................................ 327/147, 149, 327/150, 152, 153, 156, 158, 159, 161, 162

(56) References Cited

U.S. PATENT DOCUMENTS 4,604,582 A  *  8/1986  Strenkowski et al. ....... 327/147

\* cited by examiner

Primary Examiner—Tuan T. Lam

(57) ABSTRACT

An improved clock distribution system is provided for a multi block network having a series of independent blocks, with each independent block having an average load tap signal. The clock distribution circuit uses the load tap signal from the slowest independent block to synchronize the clock used in the remaining blocks. The clock for the subsequent block is tuned to the average load tap signal of the slowest block. The system clock system is incrementally delayed until it is in tuned with the average load tap signal of the slowest block, then if can be provided to the subsequent blocks of the network. The clock distribution system comprises sequential delay stages to incrementally delay the reference clock signal. The shift register controls each stage of delay, by enabling a multiplexer to allow the incrementally delayed reference clock signal to pass through. Upon reaching a match between a multiplexer output signal and the average load tap signal of the slowest previous block, the shifting stops and the delayed reference clock signal has been synchronized to the average load tap signal of the slowest block.

18 Claims, 3 Drawing Sheets

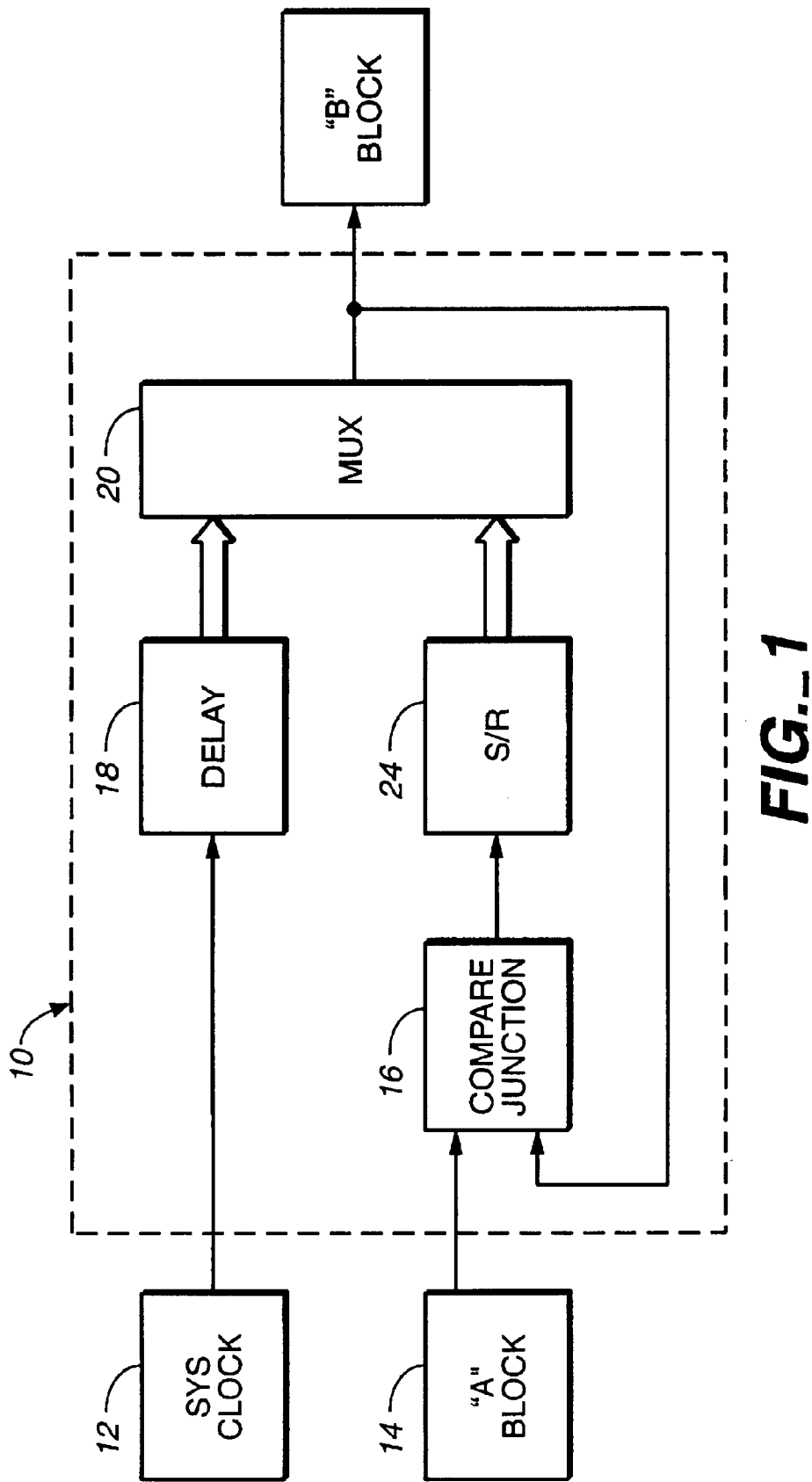
FIG._1

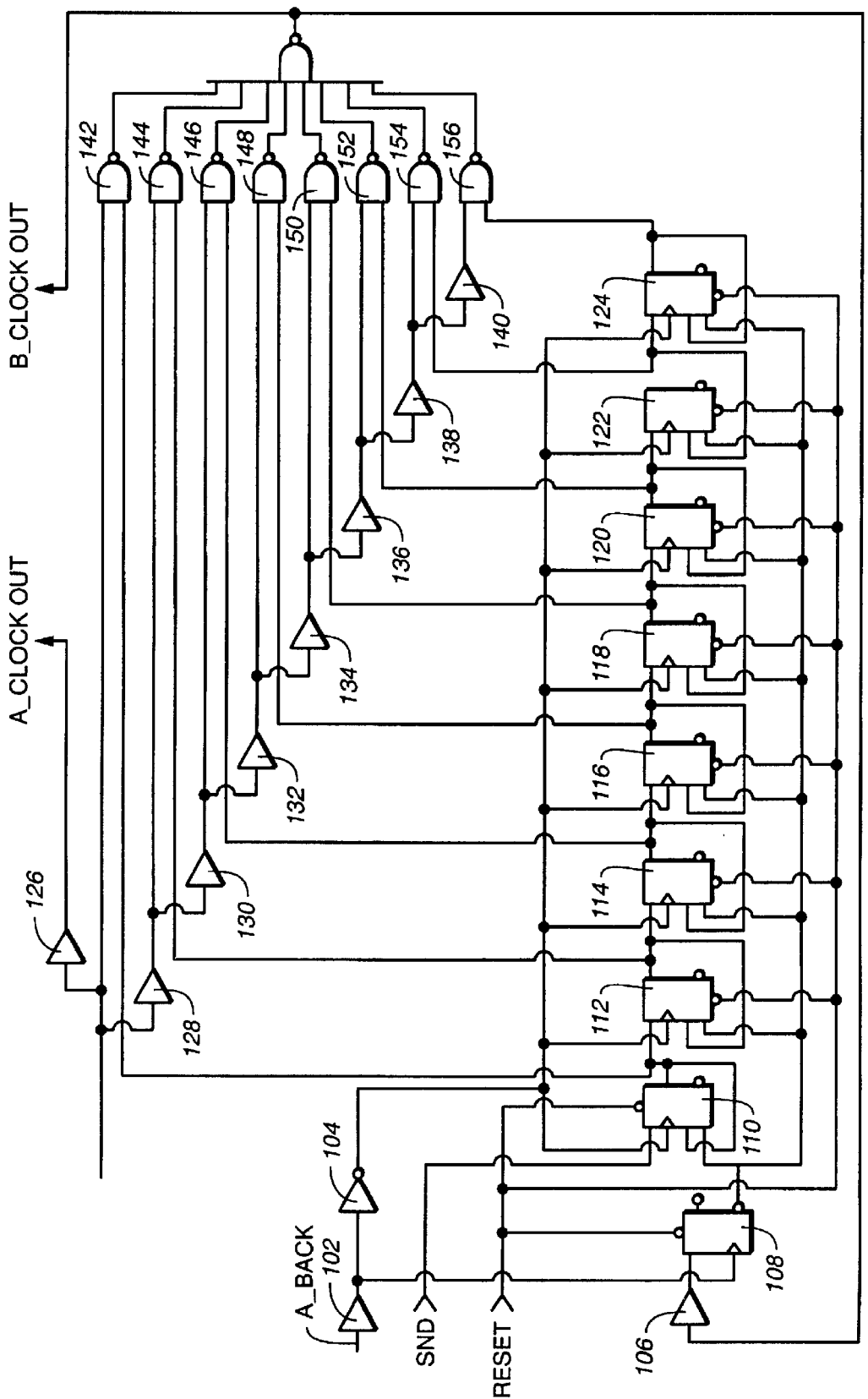
FIG._2

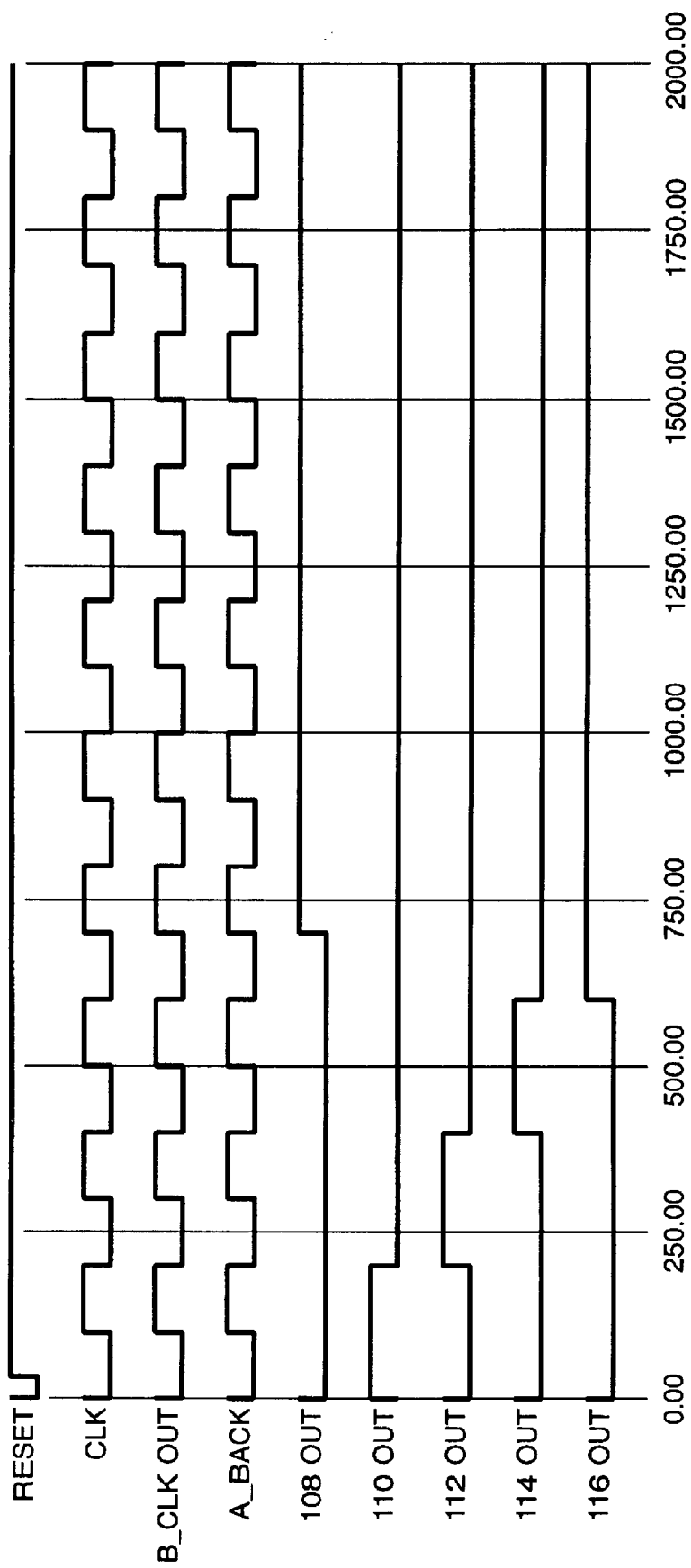
FIG._3

INTEGRATED CIRCUIT CLOCK DISTRIBUTION SYSTEM

CROSS REFERENCE TO RELATED APPLICATION

This application is a continuation of U.S. patent application Ser. No. 08/605,451, filed on Feb. 26, 1996, now abandoned, entitled "Integrated Circuit Clock Distribution System," which is incorporated herein by reference.

BACKGROUND OF THE INVENTION

1. Field of the Invention

The invention relates to a clock distribution system for integrated circuits and PC boards, and more particularly to a clock distribution system which synchronizes the operation of multiple levels of logic simulation environments.

2. Description of the Related Art

Modern large scale digital circuitry utilizes one or more clock signals transmitted to many separate levels within the circuitry, each level can consist of several circuit blocks. Uniform timing of these clock signals is critical to system operation, as the amount of time required for information to flow through the processing circuitry in a single processing cycle can determine the efficiency of the system. Generally, one system clock signal is passed to the various levels within the system.

When a system clock signal is transmitted through the circuitry, delays to the clock signal may occur within the various levels. Delays throughout a large system are caused by a number of factors, including variations in manufacturing tolerances, differing logic schemes for generating and passing the signal from one level to the next, and long transmission lone propagation time. The clock signal could experience elongation of the clock pulse dwell time, shifting of the clock phase, which is known as skew, or latency. These delays can result in one level of system integration falling out of synchronization with other levels. Thus, uniform synchronization of the clocking signals in a large system is necessary for adequate real time performance.

Prior methods of achieving clock signal synchronization have been utilized with limited success. A common method of synchronizing two clocks is to adjust the timing of the remote clock to the system clock signal. Such a solution to synchronizing two clocks is shown in U.S. Pat. No. 5,118,975, issued Jun. 2, 1992, by Hillis et al. The '975 patent utilizes a phase comparator to compare the system clock signal to the remote clock, and the phase of the remote clock is compensated to correct for the phase delay. However, this method does not fully account for inherent delays within the system. Calibrating the remote clocks to the system clock fails to resolve the problem of the system clock falling out of synchronization due to long propagation delays. Consequently, a clock delay at one level of the operating environment may differ from a delay at another level.

Similarly, the method of tuning clocks in U.S. Pat. No. 5,087,829, issued Feb. 11, 1992, by Ishibashi et al. uses a multiphase arrangement which provides tuning of multiple clocks at varying rates. The multiphase method uses a delay time detection circuit in the second phase which calculates the amount of delay in the system. Timing adjustments are accordingly made within the circuit to compensate for these system delays. This second control phase thus requires added circuitry to calculate system delay times. The delay time detection circuit depends on the number of clocks to be synchronized and the levels of delay for which to compensate. Therefore, this method does not provide a modular solution, since the circuits cannot be used interchangeably.

These prior art solutions cannot be uniformly adapted for modular application since they were either only suitable for particular designs, required significant hardware to implement, or otherwise reduced overall system performance. In view of these deficiencies in the prior art, it should be apparent that there exists a critical need for a modular integrated circuit clock distribution method.

SUMMARY OF THE INVENTION

Accordingly, it is an object of the present invention to provide a modular strategy for clock distribution within a logical simulation environment, which minimizes latency and skew delays and improves system efficiency.

The invention provides a new and improved clock distribution method for use in connection with either integrated circuit chips or printed PC boards constituting part of a digital simulation environment. The method compensates for the latency and skew delay to the clock signal induced by the independent blocks of the system.

Rather than synchronizing the clock signal provided to each block of the environment to the system clock, the method of the present invention synchronizes the clock signal for each successive block to the clock signal from a preceding block which has experienced the greatest amount of delay. This way, each of the blocks would be turned to the slowest bock and would remain in synchronization with respect to each other. Subsequent blocks can be added to the system without risk of losing synchronization.

In accomplishing these and other objections, there is provided an improved clock distribution system for a system having a series of independent blocks, with each independent block having an average load tap signal. The clock distribution circuit uses the load tap signal from the slowest independent block (A_BACK) to synchronize the clock used in the remaining blocks. The clock for the subsequent block (B_CLOCK-OUT) is tuned to the A-BACK signal. The system clock signal (CLK) is incrementially delayed until it is in tune with the A-BACK signal, then it can be provided to the subsequent block as the B-CLOCK-OUT signal.

The clock distribution system consists of several sequential delay stages to incrementally delay the CLK signal. A shift register controls each stage of delay, by enabling a multiplexer to allow the incrementally delayed CLK signal to pass. The B_CLOCK_OUT signal is compared with the A_BACK signal of the previous slowest block. As long as the B_CLOCK_OUT signal is faster than the A_BACK signal, the shift register will incrementally increase the delay placed on the CLK signal. Upon reaching a match between the B_CLOCK_OUT signal and the A BACK signal, the shifting stops and the CLK signal has been synchronized with the A_BACK signal. If the magnitude of each incremental delay is equivalent to one-eighth of a clock pulse width, it would take a maximum of eight clock cycles to bring the B_CLOCK_OUT signal into synchronization with the A_BACK signal.

A more complete understanding of the integrated circuit clock distribution system will be afforded to those skilled in the art, as well as a realization of additional advantages and objects thereof, by consideration of the following detailed description of the preferred embodiment. Reference will be made to the appended sheets of drawings, which will be first described briefly.

DESCRIPTION OF THE DRAWINGS

FIG. 1 is a functional block diagram of a clock distribution circuit in accordance with the present invention;

FIG. 2 is a detailed circuit diagram of FIG. 1; and

FIG. 3 is a timing chart which illustrates how synchronization of the signals occurs.

DESCRIPTION OF THE PREFERRED EMBODIMENT

The invention of an improved clock distribution system for a system having a series or network of independent blocks solves the significant problems experienced inn the prior art in maintaining each of the system blocks in synchronization. The invention compensates for the latency and skew delays to the clock signal commonly experienced within blocks of the network. To accomplish this result, the present invention synchronizes the system clock signal for each successive block to the clock signal from a preceding block which has experienced the greatest amount of delay. Accordingly, each subsequent block would be tuned to the slowest previous block in the network.

Referring first to FIG. 1, a functional block diagram of a clock distribution circuit 10 constructed in accordance with the invention is illustrated. The clock distribution circuit 10 receives an average load tap signal A_BACK from the previous slowest block A, shown at 14. A system clock signal (CLK) is also provided to the clock distribution circuit 10 from the reference clock 12. As known in the art, both the CLK signal and the A_BACK signal are periodic, comprising generally square wave, signals. As will be further described below, the clock distribution circuit 10 generates the B_CLOCK_OUT output signal to the subsequent block B. As a result, the B_CLOCK_OUT signal is synchronized to the A_BACK signal, and the B block is synchronized to the A block.

The clock distribution circuit 10 includes a junction 16 which compares the A_BACK signal with the B_CLOCK_OUT signal to determine if there is a time error between the signals. If the A_BACK signal is out of synchronization with respect to the B_CLOCK_OUT signal, incremental amounts of delay are added to the CLK signal which forms the B_CLOCK_OUT signal.

To add the delay, a delay network 18 is provided which feeds into a multiplexer 20. The multiplexer 20 receives a plurality of delay lines from the delay network 18, each of the delay lines having a portion of a clock pulse greater delay than its predecessor. A shift register 24 is provided which enables each sequential delay line from the delay network 18 to pass through the multiplexer 20. The shift register 24 will sequentially enable the delay lines to the multiplexer 20, until a match is reached between the A_BACK signal and the B_CLOCK_OUT signal. Once a match is reached, the shift register 24 stops shifting, and the enabled delay line having the appropriate degree of delay becomes operative as the B_CLOCK_OUT signal.

Referring now to FIG. 2, there is shown a circuit diagram which embodies the component elements of the clock distribution circuit 10 of FIG. 1. As described above, the circuit 10 receives a CLK signal from the system clock and an A_BACK signal which represents the average load tap output of the A block. The circuit 10 produces a B_CLOCK_OUT signal which comprises the clock signal to be utilized by the B block. In addition to these input signals, the circuit 10 also includes a ground signal and a reset signal. As known in the art, the ground signal provides a reference voltage level for the logic circuits, and the reset signal enables the shift register 24 to be returned to an initial state.

Delay element 106 represents the delay introduced by the B block to the B_CLOCK_OUT signal. Thus, the signal that passes through delay element 106 represents the B_BACK signal, or the average load tap signal of the B block.

The circuit 10 first compares the A_BACK signal with the B_BACK signal. The comparison is performed by a junction 108 which receives both signals. The junction can comprise a typical edge triggered flip-flop, which produces a normal logic low output signal or zero. As long as the A_BACK and B_BACK input signals are out of phase, the output of the junction 108 will remain at zero. low.

A zero signal from the junction 108 enables the shift register 24 to cycle. The shift register 24 is represented by an array of flip-flops shown at 110 through 124. As known in the art, the shift register 24 permits a data signal to be shifted sequentially from each flip-flop under control of an external clock. In the present invention, the A_BACK signal provides the input control clock after inversion by an inverter element 104. Each of the flip-flops 110 through 124 produce an output signal that will sequentially carry a logic high signal, or one. Flip-flop 110 has an initial condition of logic one. After the register 108 provides the enabling signal, flip-flop 110 remains at the logic one state, while the remaining flip-flops of the shift register 24 remain at zero. As will be further described below, the shifting output signal produced by the shift register 24 allows a desired delay line to be enabled.

The delay network 18 is shown schematically as an array of delay elements 128 through 140. Each delay element is connected in a cascading manner from the clock input signal. Each delay element provides a portion of a clock cycle magnitude of delay. The-clock signal would be delayed one full clock cycle after passing through each of the delay elements 128 through 140 if each delay element provided ⅛ of a block cycle magnitude. Each of the output signals from the shift register 24 are coupled with a respective one of the delay elements 128 through 140. This way, the shift register 24 controls the amount of delay provided by the delayed network 18 to the system clock 12.

The multiplexer 20 comprises NAND gates 142 through 156 and NAND gate 158. Each of the NAND gates 142 through 156 have two inputs, and the NAND gate 158 has eight inputs. Each of the NAND gates 142 through 156 receive a pair of signals comprising a delayed clock signal and a shift register output signal. If the shift register output signal is a zero, a one would be automatically produced by the respective NAND gate. Similarly, if a one is produced by a shift register output signal, the NAND gate would remain low, unless the delayed clock input signal went to a zero. Thus, it should be apparent that a delayed clock signal would only pass through NAND gate 142 through 156 if the particular shift register output signal is at a one state. The NAND gate 158 receives the outputs of each of the NAND gates 142 through 156, and will similarly allow the clock signal from the enabled delay line to pass through.

Referring now to both FIGS. 2 and 3, the clock distribution circuit 10 is shown in typical operation. In a condition where the A_BACK and B_BACK signals are out of synchronization, the register 108 would produce a zero output, as substantially shown in FIG. 3. Through the first clock cycle from the A_BACK signal, flip-flop 110 would remain at its initial high one state. Each of the remaining flip-flops 112 through 124 would be at zero state. NAND gate 142 would be enabled, allowing the CLK signal to pass through the multiplexer 20 as the B_CLOCK_OUT signal. Since this signal is still out of phase with the A_BACK signal, junction 108 would remain at zero. Therefore, the next clock cycle from the A_BACK signal would cause the shift register 24 to shift, moving the one signal to the output of flip-flop 112. This shift allows the NAND gate 144 to become enabled, allowing the CLK signal as delayed through the delay element 128 to pass through the multiplexer 20. Once again, the B_BACK signal would be sampled against the A_BACK signal to determine if the signals are in synchronization. If they are not in synchronization, the shift register shifts once again as substantially described above. Incrementally increased amounts of delay will be added to the clock signal until eventually the A_BACK and B_BACK signals are in phase. In FIG. 3, the output of junction 108 shifts to a logic one after the third clock cycle from the A_BACK signal. This signifies that the B_CLOCK_OUT and A_BACK signals are in phase, with the delay elements 128, 130, and 132 introducing delay onto the CLK signal.

Once the signals have become synchronized, junction 108 will change state to a logic high configuration as shown in FIG. 3. This change of state will prevent the shift register from shifting due to the clock signal input. Accordingly, the B_CLOCK_OUT signal will remain fixed with the amount of delay determined by the clock distribution circuit 10.

It is anticipated that an individual clock distribution circuit as in FIG. 2 be provided with each separate block of the network. As additional blocks are added to the network through ordinary expansion, these newer blocks will also have heir clock tuned to the previous slowest block. Thus, none of the subsequent blocks can fall out of synchronization with its predecessors since each would be slowed to the previous slowest clock rate.

Having thus described the preferred embodiment of an integrated circuit clock distribution method, it should now be apparent to those skilled in the art that the aforestated objects and advantages for the within system have been achieved. Although the present invention has been described in connection with the preferred embodiment, it is evident that numerous alternatives, modifications, variations and uses will be apparent to those skilled in the art in light of the foregoing description. For example, it should be apparent that a larger or smaller number of delay lines can be advantageously utilized to increase or decrease the amount of synchronization resolution achieved with each respective clock cycle.

For example, the shift register 24 can be fully or partially replaced by SCAN, ROM or RAM or other memory devices. Substantially the same function as is performed by the shift register can be achieved by different memory implementations. SCAN for example could read and determine whether the A_BACK and B_BACK are in sync, and if not, add additional delay necessary to synchronize. The additional delay could be achieved by way of an encoded control for the multiplexer. For example, block 24 FIG. 1 could be replaced by a three bit RAM, SCAN or ROM register controlling and eight input multiplexer. Also, preprogrammed ROM memory controls that would serve to program the delay taps MUX control can be assigned at the chip or board construction phase. It will also be appreciated that a logic complier can be utilized to integrate the above described components and circuit elements in a particular chip design using the design variables such as the length of the desired delay in order to match the set up-hold time for the compare junction 108 of FIG. 1. This would eliminate the need to synchronize the clocks after circuit construction, as will be appreciated by those skilled in the art. Accordingly, the present invention is intended to embrace all equivalencies thereto and is limited only by the spirit and scope of the appended claims.

What is claimed is:

1. A clock distribution system for synchronizing a reference clock signal of a multi-block network, the system comprising:

a network that includes a plurality of circuit blocks, each of said circuit blocks having a corresponding load tap signal, said circuit blocks comprising a previous slowest circuit block and a subsequent circuit block;

a phase comparator for comparing a load tap signal of said previous slowest circuit block with a delayed reference clock signal which is produced by delaying said reference clock signal and is applied to said subsequent circuit block, said phase comparator means providing a first enabling signal when said load tap signal of said previous slowest circuit block and said delayed reference clock signal are out of synchronization;

an enabling circuit responsive to said first enabling signal for sequentially shifting a delay line enable command between a plurality of positions;

a plurality of cascaded delay circuits arranged to delay said reference clock signal; and a multiplexer for outputting said delayed reference clock signal having a magnitude of delay determined by the position of the delay line enable command with respect to an associated one of said delay circuits;

wherein, upon reaching synchronization between said load tap signal of said previous slowest circuit block and said delayed reference clock signal, said first enabling signal is removed to maintain the previously selected one of said delay circuits in operation.

2. The clock distribution system of claim 1, wherein said phase comparator means is an edge trigger flip flop.

3. The clock distribution system of claim 1, wherein said enabling circuit is a shift register.

4. The clock distribution system of claim 1, wherein each of said delay circuits are configured to delay said reference signal by a predetermined portion of a clock cycle of said reference clock cycle of said reference clock signal.

5. The clock distribution system of claim 1, wherein said multiplexer receives an input from each of said delay circuits, wherein position of said delay line enable command in cooperation with an associated one of said delay circuits permits said delayed reference clock signal to pass through said multiplexer.

6. A method for, synchronizing a reference clock signal for a multi-block network, comprising the steps of:

forming a network that includes a plurality of circuit blocks, each of said circuit blocks having a corresponding load tap signal, said circuit blocks comprising a previous circuit block and a subsequent circuit block;

comparing a load tap signal of said previous circuit block with a delayed reference clock signal which is produced by delaying said reference clock signal and is applied to said subsequent circuit block;

producing an enabling signal when said load tap signal of said previous circuit block is out of synchronization with said delayed reference clock signal;

shifting sequentially a delay line selecting signal in response to presence of the enabling signal;

delaying said reference clock signal by an amount determined by the delay line selecting signal;

outputting the delayed reference clock signal to said subsequent block; and repeating said comparing, shifting, and delaying steps until said load tap signal of said previous circuit block and said delayed reference clock signal have become synchronized.

7. The method for synchronizing a reference clock signal of claim 6, wherein said comparing step further comprises:
inputting said load tap signal of said previous circuit block and said delayed reference clock signal into an edge triggered flip-flop, said flip-flop producing said enabling signal.

8. The method for synchronizing a reference clock signal of claim 6, further comprising:
a shift register receiving said enabling signal, and having a plurality of sequential outputs, a selected one of said sequential outputs producing said delay line selecting signal.

9. The method for synchronizing a reference clock signal of claim 6, further comprising:
a plurality of delay circuits, each of said delay circuits configured to receive said reference clock signal and produce said delayed reference clock signal, one of said delay circuits being selected by said delay line selecting signal.

10. The method for synchronizing a reference clock signal of claim 9, wherein each of said delay circuits are configured to delay said reference clock signal by one-eighth, or any portion of said reference clock cycle.

11. A clock distribution system for synchronizing a reference clock signal within a multi-block network including a plurality of circuit blocks, each of said circuit blocks having a corresponding load tap signal, the system comprising:
a previous slowest circuit block and a subsequent circuit block among said plurality of circuit blocks;
a phase comparator for comparing a load tap signal of said previous slowest circuit block with a delayed reference clock signal which is produced by delaying said reference clock signal and is applied to said subsequent circuit block, said comparator providing a first enabling signal when said load tap signal of said previous slowest circuit block and said delayed reference clock signal are out of synchronization;
an enabling circuit responsive to said first enabling signal for sequentially shifting a delay line enable command between a plurality of positions;
a plurality of delay circuits arranged to provide means for delaying said reference clock signal; and
a multiplexer for outputting said delayed reference clock signal having a magnitude of delay determined by the position of the delay line enable command with respect to an associated one of said delay circuits;
wherein, upon reaching synchronization between said load tap signal of said previous slowest circuit block and said delayed reference clock signal, said first enabling signal is removed to maintain the previously selected one of said delay circuits in synchronized operation.

12. The clock distribution system of claim 11, wherein said comparator is an edge trigger flip-flop.

13. The clock distribution system of claim 11, wherein said enabling circuit is a shift register.

14. The clock distribution system of claim 11, wherein each of said delay circuits are configured to delay said reference clock signal by a predetermined portion of a clock cycle of said reference clock signal.

15. The clock distribution system of claim 11, wherein said multiplexer receives an input from each of said delay circuits, wherein position of said delay line enable command in cooperation with an associated one of said delay circuits permits said delayed reference clock signal to pass through said multiplexer.

16. A circuit comprising:
a delay network configured to produce a plurality of delayed clock signals from a clock signal;
a multiplexer configured to present a particular delayed clock signal of said plurality of delayed clock signals as determined by a plurality of signals;
a flip-flop configured to sample said particular delayed clock signal at an edge of a periodic signal to produce an enabling signal having a first state and a second state; and
a shift register configured to (i) shift said plurality of signals while said enabling signal is in said first state and (ii) not shift said plurality of signals while said enabling signal is in said second state.

17. The circuit according to claim 16 wherein said flip-flop samples said particular delayed clock signal only once proximate every edge of said periodic signal.

18. The circuit according to claim 16, wherein said shift register only shifts in one direction.

* * * * *